United States Patent [19]

Southerland, Jr.

[11] Patent Number: 4,489,400

[45] Date of Patent: Dec. 18, 1984

[54] SERIALLY BANKED READ ONLY MEMORY

[75] Inventor: Ebbin R. Southerland, Jr., Houston, Tex.

[73] Assignee: Texas Instruments Incorporated, Dallas, Tex.

[21] Appl. No.: 353,783

[22] Filed: Mar. 1, 1982

[51] Int. Cl.[3] .............................................. G11C 11/40

[52] U.S. Cl. .................................... 365/104; 365/203; 365/230

[58] Field of Search ................ 365/104, 203, 204, 230

[56] References Cited

U.S. PATENT DOCUMENTS 4,318,014 3/1982 McAlister et al. ............. 365/203 X

*Primary Examiner*—Joseph A. Popek

*Attorney, Agent, or Firm*—Thomas E. Tyson; Leo N. Heiting; Melvin Sharp

[57] ABSTRACT

A read-only memory includes several branches of transistors which are connected to address decode circuitry together with transistors to address each of the branches where these addressing transistors are also connected to address decode circuits. Each of the addressed branches are capable of conditionally discharging a precharged node dependent upon the stored data in the transistor branches.

4 Claims, 3 Drawing Figures

SERIALLY BANKED READ ONLY MEMORY

BACKGROUND

1. Field of Invention

This invention relates to read-only memories and more particularly to serially structured read-only memories.

2. Prior Art

Read-only memories (ROMs) perform the function of providing permanent storage of data. That is, when given a specific address, the output of the ROM will always be the same and cannot later be altered. ROM structures for metal oxide semiconductor field effect transistors (MOSFETs) include two types: static and dynamic. The static type requires more silicon area and are slower than the dynamic type. However, the dynamic type requires clocking circuitry to provide precharge voltages for specific nodes within the ROM not required by the static type. This invention relates to dynamic ROMs.

Prior art structures for dynamic ROMs consist of parallel and serial structures. The parallel structure includes at least one prechargeable node connected to several parallel-connected transistors. These transistors have gates that are connected to address decoding circuitry. When the specific address for that transistor is received, that transistor gate is turned on. If the node is not to be discharged for a specific address, the transistor for that address is not completely fabricated, thus preventing the node from being discharged. The serial structure for the ROM consists of several transistors serially connected to a chargeable node, each of these serially connected transistors has a gate that is connected to address decoding circuitry. During the addressing cycle, the transistor to be addressed is left in an OFF state and all the other serially connected transistors are turned ON. If the node is to be discharged for this address, the transistor is manufactured in a depleted state and acts as a short; thus with all the other transistors in a serial connection turned ON, the node will be discharged during the discharge cycle. Alternatively if the node is not to be discharged, the transistor is manufactured in its natural state and will act as an open during the addressing cycle. Therefore the node will remain charged.

The parallel structure is faster than the serial structure because the node is discharged through only one device. However, the serial structure requires less space on a semiconductor substrate because it requires fewer interconnections.

It is the object of this invention to provide a memory structure that takes advantage of both types of structures.

SUMMARY OF THE INVENTION

In accordance with the present invention, a read-only memory is disclosed which includes several branches, each branch including several transistors corresponding to bit data. The transistors are connected in series with the final serially connected transistor being connected to a discharge circuit. Each transistor gate is connected to an address decoding circuit. The transistors are encoded by having natural or depleted doping according to the bit value for that address. The branches are connected to a chargeable node by several additional transistors. These additional transistors are also connected to the address decoding circuit. These nodes are connected to a precharge circuit and an additional circuit to read the charge on the node.

In the preferred embodiment, a plurality of branches are provided. Each branch includes a plurality of metal oxide semiconductor field effect transistors corresponding to bit data. The transistors are connected being in series with the final serially connected transistor connected to a discharge transistor. The discharge transistor is connected to the discharge clock. The gates of the data transistors are an connected to address decoding circuit such that the address decoding circuit will select a single transistor for a specific address. This single transistor corresponds to the bit value for that address. Each branch is connected to a chargeable node by a branch addressing transistor. The gates of the branch addressing transistors are in turn connected to the address decoding circuit. The chargeable nodes are also connected to to precharge circuit which provides a precharge voltage on the node during the precharge cycle. The branch addressing transistor then selects a branch to conditionally discharge the node during the conditional discharge cycle. After the conditional discharge cycle, the node is read by a sensing circuit to determine if there is a charge stored on the node. The presence or absence of a charge determines whether there is a "1" or "0" in that address state.

BRIEF DESCRIPTION OF THE DRAWINGS

The novel features believed characteristic of the invention are set forth in the claims. The invention itself, however, as well as other features and advantages thereof will be best understood by reference to detailed description which follows when read in conjunction with the accompanying drawings wherein:

BACKGROUND OF THE INVENTION

Figure 1:
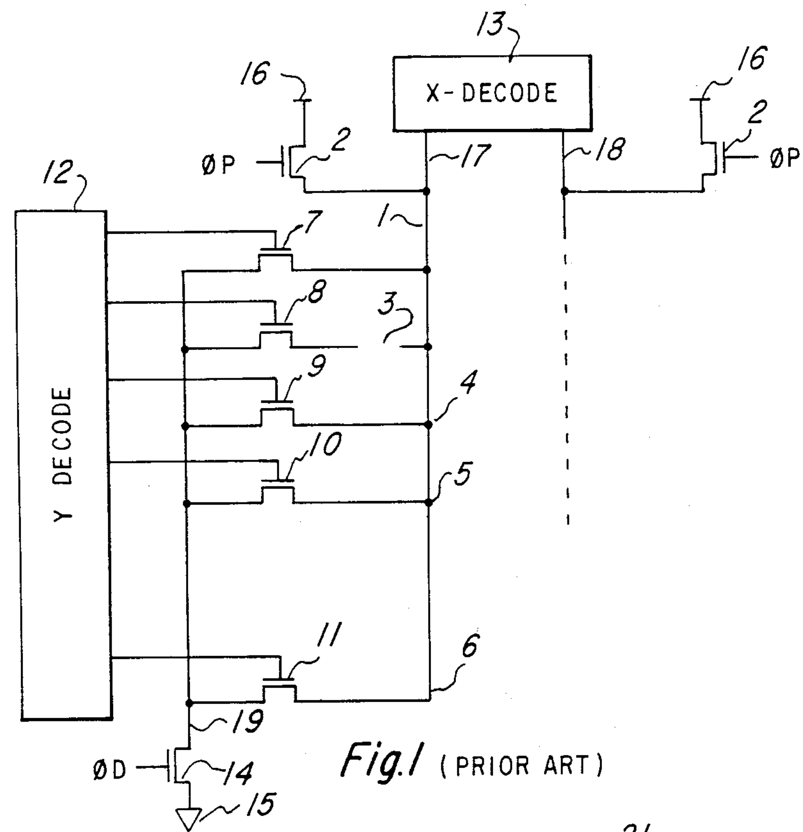
FIG. 1 illustrates the prior art parallel structure read-only memory.

A review of the prior art will enable the reader to more easily understand this invention. The ROM structure in FIG. 1 is referred to as a parallel structure. That is, the transistors with gates connected to Y decode circuit 12 are connected in parallel. The ROM is normally addressed by a word which is divided into X and Y components. The X component addresses the X decode circuit 13 and the Y components address the Y decode circuit 12. FIG. 1 is a portion of a ROM matrix that would include several Y decode lines and several X decode lines. For the ROM circuit shown in FIG. 1, the node addressed is node 1 to be addressed by line 17 in the X decode circuit 13. Node 1 is precharged through device 2 via the ROM power supply 16. Device 2 is clocked by $\phi$ P, a precharge clock. Once node 1 is charged, it can be conditionally discharged through the transistors connected to the Y decode circuit 12. To address a specific value to be stored in ROM, the Y decode circuit 12 turns on one of the parallel transistors 7 through 11. Note that transistors 7, 9, 10 and 11 are all connected to the X decode line 17. Therefore, if transistor 9 is turned on, node 1 which corresponds to node 4 will be discharged through device 14 to ground 15 upon the occurrence of the discharged clock, $\phi$ D. However, if device 8 is turned on, node 1 will not be discharged via the discharge device 14 because of the gap 3. Therefore, node 1 will remain charged and will be read by the X decode circuit 13 as a charge node during the read cycle. Note that transistor 8 can be fabricated by either eliminating the gate or by the failure to connect the transistor 8 to the X decode line 17. The advantage to the structure in FIG. 1 is that the node 1 can be easily discharged through a single transistor device to the discharge transistor 14. The disadvantage to this parallel structure is that long interconnect lines are required as shown by line 17 and line 19.

Figure 2:
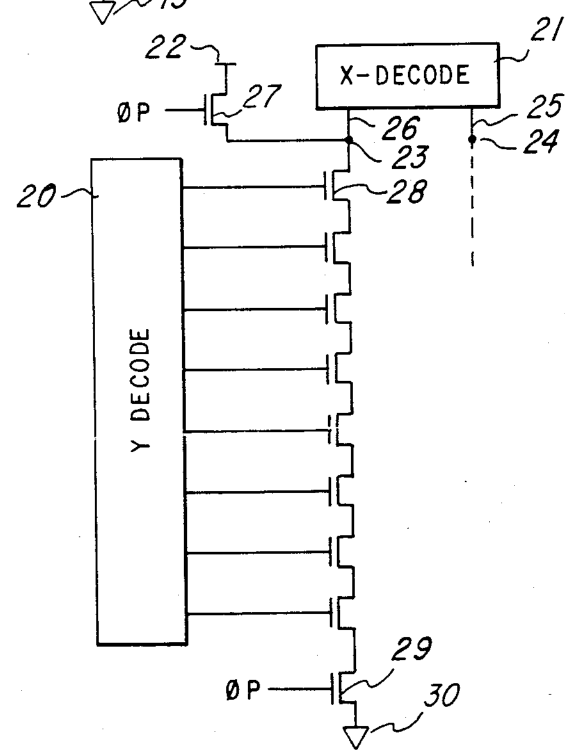
FIG. 2 illustrates the prior art serially connected read-only memory structure.

A separate approach existing in prior art is the serially connected ROM as shown in FIG. 2. The serial array is addressed in a similar manner by the X decode circuit 21 and the Y decode circuit 20 as in FIG. 1. Node 23 is precharged as before by the ROM power supply 22 through device 27 which is clocked by precharge clock $\phi$ P. Node 23 is then conditionally discharged through a series of transistors starting with transistor 28. All transistors are connected to the Y decode circuitry 20. However, to address a specific bit, all the other transistors are turned on except the addressed bit transistor. If that transistor is to represent a "0", the transistor is manufactured in a depleted state, that is, it acts as a short no matter what the gate condition is. Therefore, if transistor 28 is depleted and the gate is not turned on by Y decode circuit 20, node 23 will be discharged through device 29, when clocked by $\phi$ D, to ground 30. If, however, transistor 28 is not depleted or in its natural state without a gate voltage on device 28, node 23 will remain charged, therefore, when the X decode circuit 21 reads node 23 via line 26, a "1" will be outputted. Note that the X decode circuit 21 has the capability to read several lines located in parallel, such as line 25 that addresses node 24, for example. The main advantage of the serial circuit in FIG. 2 over the parallel circuit in FIG. 1 is that it does not require the long precharge and discharge lines as shown in FIG. 1. The disadvantage of the serial structure in FIG. 2 is that it is slower because the node must be discharged through more transistors connected in serial.

DETAILED DESCRIPTION OF THE PREFERRED EMBODIMENT

Figure 3:
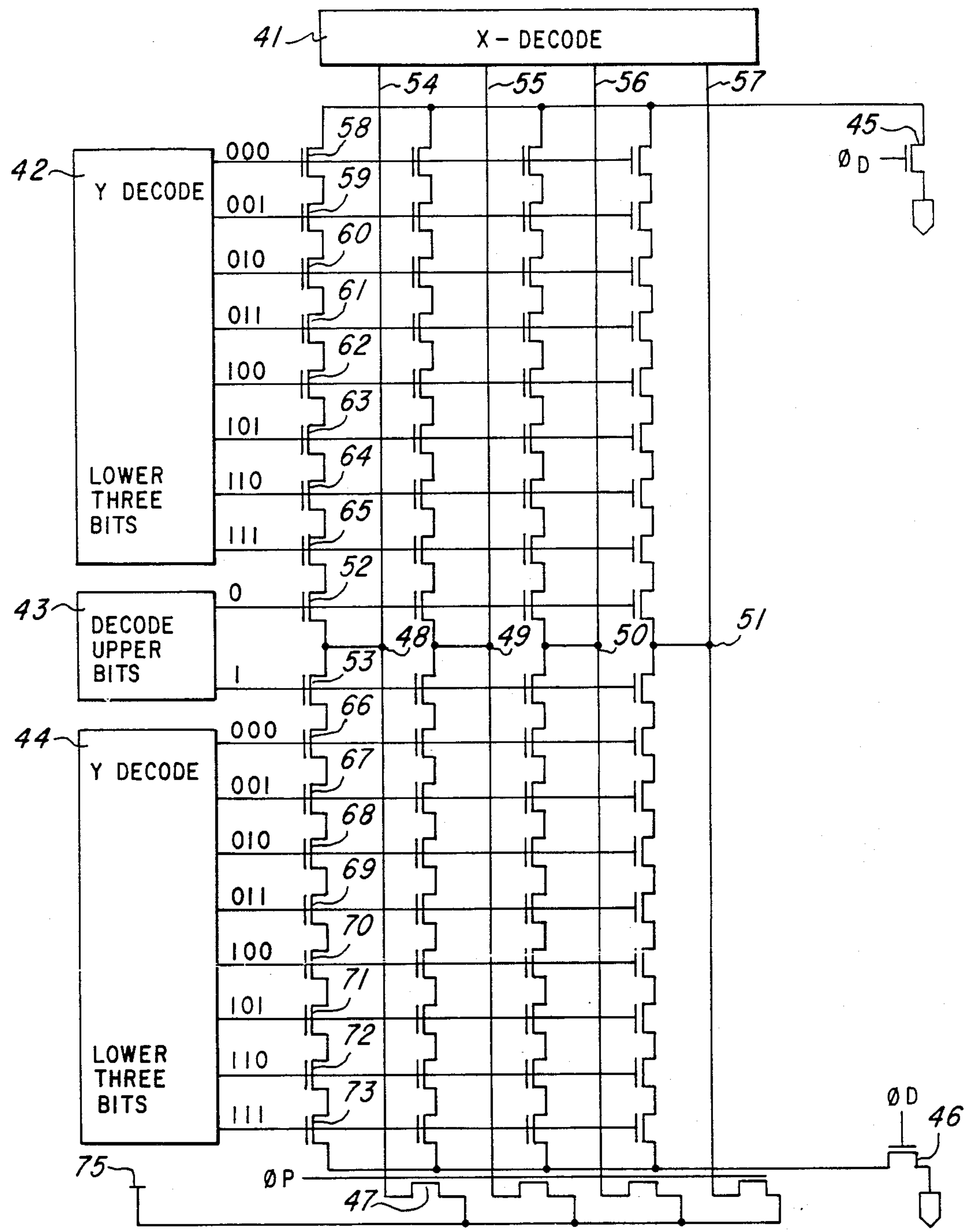
FIG. 3 represents the serially banked read-only memory structure.

This invention takes advantage of the spaced savings of the serial technique by combining the serial structure with parallel addressed transistors to produce a banked serial ROM structure as illustrated in FIG. 3. Note that the second structure in FIG. 3 contains a Y decode circuit 43 for the upper bits and two separate Y decode circuits 42 and 44 for the lower bits together with the X decode circuits 41. In a embodiment illustrated, 16 bits are addressed by the Y decode circuit in total. The 16 bits are divided into two banks of 8 bits. The 16 bits can be addressed by 4 address bits. Thus the 8 bits in the lower bank can be addressed by 3 bits and the 8 bits in the upper bank can be addressed by 3 bits. These 3 bits address one of 8 transistors in each of the two banks. The banks are selected by the upper bit. The Y decode circuitry 43 addresses the upper or the lower banks by decoding this upper address bit. The Y decode circuitries 42 and 44 address the individual 8 transistors of their respective banks. For example, transistor 61 is addressed by the address 0011.

The ROM in FIG. 3 contains 4 nodes, 48, 49, 50 and 51 that are addressed by the X decode circuit 41 through lines 54, 55, 56 and 57, respectively. Only line 54 and node 48 will be discussed in detail.

Node 48 is charged via the ROM power supply at 75 through device 47 clocked by the precharge clock $\phi$ P. Node 48 is then conditionally discharged through one of the banks of transistors 58 through 65 or 66 through 73 as determined by the two transistors 52 and 53. After the discharge cycle, node 48 is read by the X decode circuitry by line 54 as previously discussed.

For example, if transistor 61 is to be addressed, the Y decode circuit receives the address 0011. The most significant bit "0" is decoded by the Y decode circuit 43 which in turn, turns on transistor 52 and turns off transistor 53. Turning on transistor 52 enables the bank of transistors 58 through 65. The remaining portion of the address, 011, is decoded by the Y decode circuit 42 and turns on all transistors with the exception of transistor 61 in the bank of transistors 58 through 65. If transistors 61 is manufactured in a depleted state, it acts as a short and thus discharging node 48 through transistor 52 and the remaining transistors 58 through 65 during the discharge clock $\phi$ D by device 45. If, however, transistor 61 is not manufactured in a depleted state, transistor 61 is off during the discharge cycle and node 48 remains charged. Transistors 66 through 73 can be addressed in a like manner via transistor 53. One disadvantage to this structure is that for each set of banks, additional Y decode circuits and discharge circuits are required.

What is claimed is:

1. A read-only memory comprising:

a first plurality of branches divided into a first group and a second group, with each branch including a plurality of data transistors serially connected together from a first data transistor to a last data transistor with each data transistor being coded to represent a predetermined logic state;

a plurality of node means for electrically joining a member of the first group of branches to a member of the second group of branches at a member node means of the plurality of node means to form a plurality of dual branch sets thereby;

precharge circuit means for precharging the plurality of node means;

address decoding means for enabling an addressed data transistor of the plurality of data transistors;

discharge circuit means for discharging the plurality node means through the addressed data transistor when coded to represent a preselected logic state; and evaluation circuit means for evaluating the plurality of nodes.

2. The read-only memory according to claim 1, wherein said data transistors are metal oxide semiconductor field effect transistors.

3. The read-only memory according to claim 1, wherein said predetermined logic state includes a depleted doping state to represent a first logic state and a natural doping state to represent a second logic state.

4. The read-only memory according to claim 1, wherein the address means includes:

a branch address means for addressing either the first group of branches or the second group of branches.

* * * * *